United States Patent [19]

Takita et al.

[11] Patent Number: 4,979,973

[45] Date of Patent: Dec. 25, 1990

[54] PREPARATION OF FUSED SILICA GLASS BY HYDROLYSIS OF METHYL SILICATE

[75] Inventors: Masatoshi Takita; Takaaki Shimizu, both of Niigata, Japan

[73] Assignee: Shin-Etsu Chemical Co., Ltd., Tokyo, Japan

[21] Appl. No.: 404,585

[22] Filed: Sep. 8, 1989

[30] Foreign Application Priority Data

Sep. 13, 1988 [JP] Japan ................................ 63-229333
Dec. 22, 1988 [JP] Japan ................................ 63-325626
Dec. 28, 1988 [JP] Japan ................................ 63-335070

[51] Int. Cl.$^5$ .............................................. C03B 8/02
[52] U.S. Cl. ...................................... 65/18.1; 65/900; 65/901; 501/12
[58] Field of Search .................. 65/18.1, 17, 900, 901; 501/12

[56] References Cited

U.S. PATENT DOCUMENTS

| 3,597,252 | 8/1971 | Schroder et al. | 65/901 |
| 4,266,978 | 5/1981 | Prochazha | 65/901 |
| 4,500,657 | 2/1985 | Kumar | 522/10 |
| 4,572,729 | 2/1986 | Lang et al. | 65/18.1 |
| 4,747,863 | 5/1988 | Claser et al. | 65/901 |
| 4,767,433 | 8/1988 | Iura et al. | 65/18.1 |

FOREIGN PATENT DOCUMENTS

| 2075003 | 11/1981 | United Kingdom | 65/901 |
| 2165234 | 4/1986 | United Kingdom | 65/901 |

*Primary Examiner*—David L. Lacey
*Assistant Examiner*—Todd J. Burns
*Attorney, Agent, or Firm*—McAulay Fisher Nissen & Goldberg

[57] ABSTRACT

The invention provides a method for the preparation of synthetic fused silica glass containing a very small amount of hydroxyl groups and has a high viscosity at high temperatures suitable for use as a material of articles for semiconductor processing at high temperatures, such as a crucible for Czochralski single crystal growing of semiconductor silicon. The method comprises hydrolyzing methyl silicate in a medium containing a specified amount of ammonia as a hydrolysis catalyst to form silica particles which are heat-treated in several successive steps.

4 Claims, No Drawings

PREPARATION OF FUSED SILICA GLASS BY HYDROLYSIS OF METHYL SILICATE

BACKGROUND OF THE INVENTION

The present invention relates to a synthetic fused silica glass and a method for the preparation thereof. More particularly, the invention relates to synthetic fused silica glass containing hydroxyl groups only in an extremely low content of 1 ppm or below and having a remarkably high viscosity at high temperatures so as to be useful as a crucible for the crystal growing of semiconductor silicon single crystals by the Czochralski method and other tools employed in the processing of semiconductors as well as to a so-called sol-gel method for the preparation of such high-grade fused silica glass.

As is well known, various kinds of semiconductors or, in particular, high-purity silicon in the form of a single crystal are obtained by growing the single crystal in the so-called Czochralski method from a melt of the semiconductor substance contained in a crucible. The material of the crucibles is mostly fused quartz glass which is conventionally prepared by melting natural quartz crystals. One of the problems in natural quartz glass, when an article, e.g., crucible, made from such glass is used in semiconductor processing, is that the glass unavoidably contains various kinds of metallic impurities which badly affect the quality of the semiconductor products, e.g., silicon single crystals, grown by using such a crucible resulting in a decreased yield of acceptable semiconductor products. Accordingly, it is a key requirement that the material of the articles such as crucibles used in the semiconductor processing has a purity as high as possible.

In view of the above mentioned problem relative to the purity of fused quartz glass, it is a trend in recent years that crucibles for single crystal growing of silicon made from natural quartz are increasingly under replacement with those made from synthetic fused silica glass. Several different methods are known in the prior art for the preparation of such high-purity synthetic fused silica glass including the so-called flame hydrolysis method in which a silicon-containing volatile compound such as silicon tetrachloride is pyrolytically hydrolyzed in an oxyhydrogen flame to give silica particles which are then fused and vitrified into fused silica glass. One of the most serious disadvantages in this flame hydrolysis method is that the thus produced fused silica glass usually contains a large amount of hydroxyl groups in an amount sometimes exceeding 1000 ppm with a consequently low viscosity of the glass at high temperatures and eventual foaming of the glass when it is melted in vacuum.

As a modification of the above described pyrolysis of a volatile silicon compound, a method of using a plasma flame in place of the oxyhydrogen flame has been proposed. This method of plasma pyrolysis, however, is not suitable as an industrial process due to the high cost for the plasma flame generation and the difficulties sometimes encountered when the method is applied to mass production of fused silica glass.

Apart from the above described pyrolytic methods, a method recently highlighted is the so-called sol-gel method in which a hydrolyzable silicon compound such as ethyl orthosilicate is hydrolyzed in a hydrolysis medium to prepare a silica sol which is subsequently converted into a gel. Fused silica glass is obtained by calcination and fusion of the silica gel after drying. This sol-gel method, however, does not provide a full improvement in respect of the content of hydroxyl groups in the fused silica glass if not to mention the disadvantage due to the relatively long time taken for the method. Despite the above mentioned problems, the sol-gel method is preferred as a method for the preparation of fused silica glass for use as a material of optical fibers, photomask plates for lithographic processing of ICs, optical lenses and the like owing to the nearly perfect amorphousness of the glass obtained by the method.

Several attempts and proposals have been made in the prior art for the improvement of the properties of the fused silica glass to be used in the above mentioned optical applications as prepared by the sol-gel method including a method taught in Japanese Patent Kokai 62-241837 in which fine silica particles obtained by the hydrolysis of an alkyl silicate in the presence of a basic catalyst in the hydrolysis medium are blended with a silica sol obtained by the hydrolysis of an alkyl silicate in the presence of an acidic catalyst, a method taught by D. W. Scheere et al. in Journal of Non-crystalline Solids, volume 63, pages 163–172 (1984) in which silica particles obtained by the oxidation of silicon tetrachloride are dispersed in chloroform containing n-propyl alcohol as a dispersing aid and the dispersion is then gelled by using ammonia vapor, and so on.

Application of fused silica glass obtained by the sol-gel method to non-optical refractory silica glass articles, such as crucibles, is also under investigation. For example, Japanese Patent Kokai No. 63-166730 teaches a method in which silica particles obtained by the hydrolysis of a hydrolyzable silicon compound by using an acidic catalyst in the presence of an alkaline ingredient such as sodium are first transformed into a crystalline form of α-cristobalite before the silica is melted to give fused silica glass.

The sol-gel method in the prior art in general has disadvantages in respect of the relatively low productivity as an industrial process and large energy consumption required for removing a large amount of the solvent used as the hydrolysis medium. The above mentioned method taught in Japanese Patent Kokai No. 62-241837 is not suitable as a method for the preparation of fused silica glass having a high viscosity at high temperatures comparable to that of natural quartz glass so that the glass prepared by the method cannot be used as a material of articles used in high-temperature processing of semiconductors. The method described in the above mentioned Japanese Patent Kokai No. 63-166730 has a disadvantage in respect of the difficulty in removing the sodium impurity so that the glass obtained by the method cannot be used as a material for the heat treatment of semiconductors although the glass may have a sufficiently high viscosity at high temperatures

SUMMARY OF THE INVENTION

The present invention accordingly has an object to provide a novel sol-gel method for the preparation of fused silica glass free from the above described problems and disadvantages in the prior art methods.

Thus, the method of the present invention for the preparation of fused silica glass comprises the steps of:
(a) hydrolyzing methyl silicate in a hydrolysis medium which is mainly composed of methyl alcohol or water containing ammonia as a hydrolysis catalyst to give silica particles, the amount of the ammonia in the hydrolysis medium being in the range from 300 to 1000 moles, when the hydrolysis medium is mainly composed of methyl alcohol, or in the range from 100 to 300 moles, when the hydrolysis medium is mainly composed of water, per 100 moles of the methyl silicate;

(b) separating the silica particles from the hydrolysis medium;

(c) drying and heating the silica particles in air to oxidize organic matters or materials;

(d) sintering the silica particles into a sintered block at a temperature in the range from 1500° to 1850° C.;

(e) disintegrating the sintered block into a powdery form of silica;

(f) cleaning the silica in the powdery form by washing with an acid; and (g) sintering the silica powder into a vitrified form at a temperature higher than 1700° C.

The fused silica glass prepared by the above described method has a viscosity of at least $10^{10}$ poise at 1400° C., Vickers hardness of at least 1000 kg/mm$^2$, Young's modulus of at least 90 GPa and electric volume resistivity at 1200° C. of at least $10^8$ ohm.cm. Further, the purity of the silica glass relative to metallic impurities is so high that the content of each of aluminum, iron, sodium, potassium, calcium and the like is 0.2 ppm at the highest.

DETAILED DESCRIPTION OF THE PREFERRED EMBODIMENTS

In the first step of the inventive method, the starting material is orthomethyl silicate Si(OCH$_3$)$_4$ which is hydrolyzed in a hydrolysis medium containing ammonia as a hydrolysis catalyst. The hydrolysis medium in one embodiment of the inventive method is mainly composed of methyl alcohol. This is in contrast to conventional sol-gel methods in which orthoethyl silicate as the starting material is hydrolyzed in ethyl alcohol as the hydrolysis medium containing ammonia or hydrogen chloride as the hydrolysis catalyst. In a hydrolysis medium containing ammonia, replacement of the conventional ethyl silicate with methyl silicate is advantageous not only in the decreased cost for the starting material but also in the increased reaction velocity of hydrolysis. When methyl silicate is added dropwise into hydrous methyl alcohol as the hydrolysis medium containing ammonia, the reaction of hydrolysis instantaneously proceeds to form silica particles. The average particle diameter of the thus produced silica particles can be controlled by adequately selecting various factors such as the relative amounts of methyl alcohol, water, ammonia and methyl silicate, reaction temperature, velocity of agitation and others. It is preferable in order that the silica particles give a mass when dried and the fused silica glass prepared therefrom contains an outstandingly small amount of hydroxyl groups that the silica patrticles have an average particle diameter of at least 200 nm or, more preferably, in the range from 200 to 3000 nm of monodisperse distribution. Such a particle size distribution can be obtained by conducting the hydrolysis of methyl silicate in a medium of methyl alcohol containing from 300 to 1000 moles of ammonia per 100 moles of the methyl silicate at a temperature in the range from 10° to 40° C.

The silica particles produced in the above described manner are then separated from the hydrolysis medium in step (b) by a known solid-liquid separation process including spontaneous settling and decantation, filtration, centrifugal separation and the like. The wet silica particles are dried in an atmosphere of vacuum, nitrogen gas or air and then heated in step (c) in an oxygen-containing atmosphere such as air by increasing temperature up to 1000° C. by taking, for example, 10 hours from room temperature so that any trace amount of organic matters can be completely removed by oxidation.

The thus dried and heat-treated silica particles are then subjected in step (d) to a heat treatment at about 1500° to 1850° C. for a length of time of 7 to 8 hours in an atmosphere of vacuum, air or helium gas so that the particles are sintered with the pores closed to be converted into a sintered mass having a density approximately equal to that of conventional fused quartz glass.

The sintered mass of the silica particles is then crushed and pulverized in step (e) in a suitable pulverizing machine such as ball mills, roller mills, rod mills and the like into a powder having such a particle size distribution as to pass a 50 mesh screen but to be retained on a 200 mesh screen in the Tylar standard of sieves. The thus obtained silica powder is subjected to a cleaning treatment in step (f) by washing with a dilute acid such as hydrochloric and/or hydrofluoric acids followed by thorough washing with pure water and drying. Finally, the dried silica powder is sintered and shaped in step (g) into a desired form by heating in vacuum or in an atmosphere of an inert gas or air at a temperature of 1700° C. or higher followed by cooling to give a fused silica glass body.

The thus obtained synthetic fused silica glass contains hydroxyl groups in an extremely small amount of, for example, 1 ppm or smaller and has a characteristically high viscosity at high temperatures of, for example, 1 to $4 \times 10^{10}$ poise at 1400° C. as a consequence of the very regular structure of the particles. Therefore, the fused silica glass is used advantageously as a material of fused quartz glass crucibles employed in the Czochralski single crystal growing of semiconductor silicon.

In another embodiment of the inventive method, the hydrolysis medium is water containing ammonia as the hydrolysis catalyst. Namely, methyl silicate as the starting material is added dropwise to water containing ammonia at a temperature not exceeding 50° C. to effect the hydrolysis reaction of methyl silicate so that the primary particles of silica formed in the hydrolysis medium containing no methyl alcohol have a particle diameter in the range from 100 to 500 nm, which in turn form agglomerate particles having an apparent average diameter in the range from 10 to 100 μm. The amount of water as the hydrolysis medium should be at least three moles per mole of the methyl silicate and the amount of ammonia in the hydrolysis medium should be in the range from 100 to 300 moles per 100 moles of the methyl silicate in order that the three-dimensional structure of the silica particles can be formed smoothly. The primary particles contain hydroxyl groups but the site of the bonded hydroxyl groups is limited only to the silicon atoms in the surface layer of the particles and substantially no hydroxyl groups are bonded to the silicon atoms in the core portion of the particles. Accordingly, the primary particles are packed only loosely to give the agglomerate particles so that the hydroxyl groups on the surface of the primary particles can be readily removed by heating to effect densification of the agglomerate particles in a regular manner.

The thus obtained agglomerate particles are then easily separated from the hydrolysis medium by a known solid-liquid separation process including spontaneous settling and decantation, filtration, centrifugal separation and the like followed by drying at a temperature in the range from 100° to 200° C. for a length of time in the range from 5 to 10 hours. By virtue of the densification of the particles, the volume of the hydrolysis medium retained by the particles after the solid-liquid separation is so small that the thermal energy required for drying can be greatly reduced as compared with the energy consumption in conventional sol-gel methods.

The dried silica particles are then subjected to a heat treatment at a temperature in the range from 300° to 1000° C. for 7 to 8 hours in an oxidizing atmosphere such as air so as to oxidize and remove any trace amount of the organic matter contained therein. The heat-treated silica particles are then subjected to a sintering treatment by heating at a temperature of 1500° C. to 1850° C. in an atmosphere of vacuum, air or an inert gas. The sintered silica particles are then pulverized in a suitable pulverizing machine to have such a particle size distribution, for example, as to pass a 50 mesh screen but to be retained on a 200 mesh screen in the Tylar standard of sieves. The thus obtained silica powder is subjected to a cleaning treatment by washing with a dilute acid such as hydrochloric and/or hydrofluoric acids followed by thorough washing with pure water and drying. Finally, the dried silica powder is sintered and shaped into a desired vitrified form by heating in vacuum or in an atmosphere of air or an inert gas at a temperature of 1700° C. or higher followed by cooling to give a fused silica glass body.

It is not a particularly difficult matter that the synthetic fused silica glass prepared by the above described inventive method has an extremely high purity relative to metallic impurities such as aluminum, iron, sodium, potassium, calcium and the like at a level of 0.2 ppm or below for each of the metallic elements. The fused silica glass may have a viscosity at high temperatures of at least $10^{10}$ poise at 1400° C. In addition, the silica glass may have a Vickers hardness of at least 1000 kg/mm$^2$, Young's modulus of at least 90 GPa and electric volume resistivity of at least $10^8$ ohm.cm at 1200° C. Therefore, the inventive fused silica glass is useful as a material of articles for semiconductor processing at high temperatures including not only crucibles for Czochralski single crystal growing of silicon but also diffusion tubes and other tools used in the diffusion process, washing tanks, high-temperature insulators, substrate plates for various devices and the like.

Following description may well explain the reason for the improvement in the properties of the fused silica glass prepared by the inventive method. Namely, the velocity of the hydrolysis reaction of methyl silicate is so high in the medium of methyl alcohol containing ammonia in a specified amount that formation of the hydroxyl groups by the hydrolysis is immediately followed by the polycondensation reaction between the hydroxyl groups to produce a siloxane linkage $\equiv$Si—O—Si$\equiv$ leaving almost no uncondensed hydroxyl groups in the core portion of the silica particles even though the hydroxyl groups may be bonded to the silicon atoms in the surface layer. Accordingly, the undesirable hydroxyl groups can be readily condensed to form further siloxane linkages by the heat treatment for sintering so that the silica particles have a relatively high regularity in the siloxane structure leading to the outstandingly high viscosity of the silica glass at high temperatures.

In contrast to the inventive method, the velocity of hydrolysis of an alkyl silicate is usually low with an acidic catalyst so that the silica particles formed thereby has a well developed structure of linear polysiloxane linkages retaining a large amount of hydroxyl groups bonded to the silicon atoms not only in the surface layer but also in the core portion of the particles. When such silica particles are converted into fused silica glass, the glass sometimes may be subject to foaming and the siloxane linkages therein having a relatively irregular structure may be readily broken at high temperatures to give the silica glass with a decreased viscosity. This explanation is applicable also to the silica glass prepared from water glass, i.e. sodium silicate, as the starting material having a low viscosity at high temperatures.

In the following, the method of the present invention is described in more detail by way of examples.

EXAMPLE 1

Into a reaction vessel were introduced 4800 g (150 moles) of methyl alcohol, 79 g of pure water and 2931 g of ammonia water of 29% by weight concentration (50 moles as ammonia) to form a mixture as the hydrolysis medium and 1520 g (10 moles) of methyl silicate were added dropwise into the mixture kept at 20° C. in the reaction vessel over a period of 120 minutes to effect the hydrolysis reaction of methyl silicate. The silica particles formed in the reaction mixture were settled by standing and taken by decantation of the supernatant. The wet silica powder was dried under reduced pressure at 150° C. to give a dried silica powder having an average particle diameter of 700 nm according to the result of the electron microscopic examination.

The silica powder was then heated in air by increasing the temperature from 300° C. to 1000° C. taking 8 hours and keeping for 2 hours at this temperature so as to oxidize and remove the organic matter contained therein. Thereafter, the silica powder was heated in vacuum by increasing the temperature up to 1850° C. taking 8 hours and keeping for 30 minutes at this temperature so that an apparently transparent glassy block was obtained in a yield of 93% calculated from the starting methyl silicate.

The glassy block was pulverized in a conical ball mill to have such a particle size distribution as to pass a screen of 50 mesh but to be retained on a screen of 200 mesh. The silica powder was washed with a diluted hydrochloric acid and calcined at 800° C. followed by magnetic separation. The thus refined silica powder was sintered by increasing the temperature to 1950° C. taking one hour and keeping for 30 minutes at this temperature in an atmosphere of argon gas and shaped into a disc of opaque synthetic fused silica glass having a diameter of 30 mm and a thickness of 5 mm. No hydroxyl groups could be detected in this fused silica glass disc by the infrared absorption spectrophotometry. The silica glass contained 60 ppb of aluminum, 75 ppb of iron, 35 ppb of sodium and 20 ppb of potassium as the metallic impurities according to the results of Zeeman atomic absorption spectrophotometric analysis.

When sintering and shaping of the above described refined silica powder was conducted at 1800° C. for 15 minutes in an atmosphere of vacuum instead of the atmosphere of argon gas, a transparent disc of fused silica glass was obtained, in which no hydroxyl groups could be detected.

Further, the refined silica powder was sintered and shaped by heating with electric arc in air into a crucible which was opaque and contained 15 ppm of hydroxyl groups presumably due to moisture absorption of the powder before sintering.

The above obtained discs and crucible of fused silica glass were subjected to the measurement of the viscosity at high temperatures by the fiber-elongation method to find that the values of viscosity at 1400° C. were $2.5 \times 10^{10}$ poise for the disc sintered in argon, $3.7 \times 10^{10}$ poise for the disc sintered in vacuum and $1.9 \times 10^{10}$ poise for the arc-sintered crucible.

COMPARATIVE EXAMPLE 1

Silica particles were prepared by hydrolyzing methyl silicate in substantially the same manner as in Example 1 except that the amount of ammonia in the hydrolysis medium was 1 mole instead of 50 moles and the temperature of the hydrolysis medium was kept at 80° C. The thus obtained silica particles had an average particle diameter of 100 nm.

Thereafter, the silica powder was heated in air at 500° C. to oxidize and remove the organic matter contained therein and then heated at 1500° C. in vacuum with an intention to obtain a glassy block as in Example 1. The result was that foaming of the glass took place not to give transparent silica beads.

COMPARATIVE EXAMPLE 2.

Silica particles were prepared by hydrolyzing methyl silicate in substantially the same manner as in Example 1 except that the temperature of the hydrolysis medium was kept at 0° C. The thus obtained silica particles had an average particle diameter of 3200 nm.

Thereafter, the silica powder was heated in air at 500° C. to oxidize and remove the organic matter contained therein. Agglomeration of the primary silica particles did not take place by this heat treatment. A subsequent heat treatment of the silica powder at 1500° C. gave an opaque mass of sintered silica including many bubbles.

The sintered mass of silica was pulverized and sintered in the same manner as in Example 1 at 1800° C. in an atmosphere of vacuum to give a transparent silica glass body. The glass body, however, contained bubbles of which the largest one had a diameter of 1 mm or larger although no hydroxyl groups could be detected therein.

EXAMPLE 2

Into a glass-lined reaction vessel of 500 liter capacity were introduced 30 liters of pure water and 130 liters of ammonia water of semiconductor grade containing 29% of ammonia (1996 moles as ammonia) to form a hydrolysis medium and 265 kg (1743 moles) of methyl silicate were added dropwise to the hydrolysis medium kept at 20° to 40° C. under agitation over a period of 120 minutes to form silica particles. The amount of ammonia was 115% by moles relative to the methyl silicate. After completion of the dropwise addition of methyl silicate, the silica particles were dehydrated and recovered by centrifugation at a velocity of 2000 rpm by using a filter cloth of 800 mesh openings. The yield of the silica powder was 105 kg as dried. The powder was composed of polydisperse agglomerates of 10 to 100 μm diameter formed from primary particles having a diameter of 100 to 500 nm.

The silica powder was then dried by heating at 150° C. under a stream of nitrogen gas and then subjected to a heat treatment in a quartz glass tube under a stream of oxygen gas by increasing the temperature from room temperature up to 1000° C. taking 10 hours. Thereafter, casings of high-purity graphite were filled each with a 25 kg portion of the thus heat-treated silica powder which was sintered by heating in vacuum with temperature elevation from room temperature to 1500° C. taking 2 hours and then from 1500° C. to 1850° C. taking 8 hours.

The sintered mass of silica particles was crushed and pulverized to have a particle size distribution of 50 to 80 mesh and the silica powder was washed successively with diluted hydrochloric and hydrofluoric acids followed by drying and magnetic separation. A rotatable metal mold of crucible form having a water-cooling jacket was filled with the thus refined silica powder which was melted by heating with arc at a temperature of 2400° to 2600° C. in an atmosphere of air to give a fused silica glass crucible which was, though not completely, transparent and had a viscosity of $3.8 \times 10^{10}$ poise at 1400° C. as determined by the fiber-elongation method. This fused silica glass contained less than 0.1 ppm of each of the metallic impurities including aluminum, iron, sodium, potassium and calcium.

EXAMPLE 3

The procedure was substantially the same as in Example 2 described above except that sintering and shaping of the refined silica powder was conducted by filling a high-purity graphite mold which was heated in vacuum of $10^{-3}$ Torr pressure with temperature elevation from room temperature to 1850° C. taking 20 hours to give a cylindrical block of fused silica glass having a diameter of 300 mm and a height of 600 mm with good transparency.

The table below shows the contents of metallic impurities in ppm in the above obtained fused silica glass, referred to as the glass I hereinbelow, and the viscosity thereof at 1400° C. as well as other physical parameters together with the corresponding data obtained for a commercial product of synthetic fused silica glass (Suprasil, a product by Heraeus Co., West Germany), referred to as the glass II hereinbelow, and a commercial product of fused natural quartz glass (Heralux, a product by the same company as above), referred to as the glass III hereinbelow.

TABLE

| Glass Impurities, ppm | I | II | III |
| --- | --- | --- | --- |
| Al | 0.06 | 0.06 | 20 |
| Fe | 0.075 | 0.05 | 1 |
| Na | 0.03 | 0.02 | 2 |
| K | 0.02 | 0.02 | 2 |
| Ca | 0.06 | 0.01 | 1 |
| Viscosity at 1400° C. $10^{10}$ poise | 7.0 | 0.55 | 3.5 |
| Vickers hardness, kg/mm$^2$ | 1200 | 780 | 790 |
| Young's modulus, GPa | 95 | 72 | 73 |
| Volume resistivity, $10^8$ ohm.cm | 1.0 | 5 | 0.7 |

EXAMPLE 4

A fused quartz glass crucible was filled with the silica powder after calcination at 1000° C. obtained in Example 2 and the powder was sintered by heating in vacuum with temperature elevation from room temperature to 1850° C. taking 7 hours. The sintered silica powder was then pulverized to have an average particle diameter of 50 μm followed by washing with diluted hydrochloric and hydrofluoric acids, thorough washing with water and drying. A high-purity graphite vessel was filled with the thus refined silica powder and heated in vacuum of $10^{-3}$ Torr pressure with temperature elevation from room temperature up to 1800° C. taking 20 hours to sinter and shape the silica powder into a cylindrical block of fused silica glass having good transparency. This fused silica glass contained each less than 0.2 ppm of metallic impurities including aluminum, iron, sodium, potassium and calcium and had a viscosity of $7.5 \times 10^{10}$ poise at 1400° C.

COMPARATIVE EXAMPLE 3

Silica gel was prepared by adding dropwise 50 liters of 0.1N hydrochloric acid to 26.5 kg of methyl silicate kept at a temperature of 60° to 65° C. taking 2 hours followed by removal of water and methyl alcohol produced by the hydrolysis by distillation. The thus obtained silica gel contained 12% by weight of water.

The silica gel was heated in air by increasing the temperature from room temperature to 1000° C. taking 6 hours and then keeping for 2 hours at this temperature. Thereafter, the silica was heated in an atmosphere of reduced pressure by increasing the temperature up to 1800° C. taking 5 hours and keeping for 30 minutes at this temperature to give a vitrified but foamed silica glass body. The foamed silica glass body was crushed and pulverized into a powder having a particle size distribution to pass a 50 mesh screen but to be retained on a 200 mesh screen. After washing with a diluted hydrochloric acid, thorough washing with water and drying, the silica powder was calcined at 800° C. and then shaped and sintered in a high-purity graphite vessel in an atmosphere of argon gas by heating at 1850° C. for 30 minutes to give a block of opaque fused silica glass having a diameter of 30 mm and a thickness of 10 mm. This fused silica glass contained 50 ppb of aluminum, 150 ppb of iron, 45 ppb of sodium and 25 ppb of potassium and had a viscosity of $8.0 \times 10^9$ poise at 1400° C.

COMPARATIVE EXAMPLE 4

Silica gel was prepared by adding dropwise 1.0 kg of an aqueous solution of sodium silicate containing 29.0% by weight of $SiO_2$ and 9.6% by weight of $Na_2O$ into 2.271 liters of 4N sulfuric acid kept at 80° C. and the mixture was filtered to collect the precipitates followed by washing with water and drying. After calcination in air at 1000° C. for 3 hours, the silica powder was packed in a quartz glass tube and heated at 1250° C. for 30 minutes under a stream of hydrogen chloride gas at a flow rate of 0.2 ml/second and then at 1300° C. for one hour with switching of the hydrogen chloride gas to oxygen gas. The thus obtained silica powder contained 1.2 ppm of aluminum, 0.6 ppm of iron, 0.5 ppm of sodium and 0.3 ppm of potassium.

The silica powder was shaped and sintered by heating at 1850° C. for 30 minutes in an atmosphere of argon gas to give a block of opaque fused silica glass having a diameter of 30 mm and a thickness of 10 mm. The result of an infrared absorption spectrophotometric analysis of this glass indicated that the content of hydroxyl groups therein was 9 ppm. The glass had a viscosity of $9.1 \times 10^9$ poise at 1400° C.

What is claimed is:

1. A method for the preparation of fused silica glass which comprises the successive steps of:
    (a) adding methyl silicate to water as a hydrolysis medium containing ammonia as a catalyst to effect hydrolysis of the methyl silicate forming agglomerated silica particles;
    (b) separating the silica particles from the hydrolysis medium;
    (c) heating the silica particles in an oxidizing atmosphere to oxidize and remove organic materials contained therein at a temperature of from 300° to 1000° C.;
    (d) sintering the silica particles by heating at a temperature in the range from 1500° to 1850° C.;
    (e) pulverizing the sintered silica particles into a silica powder;
    (f) washing the silica powder with an acid; and
    (g) shaping and sintering the silica powder after washing with said acid by heating at a temperature of 1700° C. or higher to form said silica glass.

2. The method according to claim 1 wherein the hydrolysis medium contains from 100 to 300 moles of ammonia per 100 moles of methyl silicate and is kept at a temperature in the range from 0° to 50° C.

3. The method according to claim 2 wherein separation of the silica particles from the hydrolysis medium in step (b) is performed by filtration.

4. The method according to claim 1 wherein the acid used in step (f) is hydrochloric acid or hydrofluoric acid.

* * * * *